(12) United States Patent
Heinrich et al.

(10) Patent No.: US 8,436,425 B2
(45) Date of Patent: May 7, 2013

(54) SOI SEMICONDUCTOR DEVICE COMPRISING SUBSTRATE DIODES HAVING A TOPOGRAPHY TOLERANT CONTACT STRUCTURE

(75) Inventors: Jens Heinrich, Wachau (DE); Kai Frohberg, Niederau (DE); Kerstin Ruttloff, Hainichen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 286 days.

(21) Appl. No.: 12/915,168

(22) Filed: Oct. 29, 2010

(65) Prior Publication Data

US 2011/0186929 A1    Aug. 4, 2011

(30) Foreign Application Priority Data

Jan. 29, 2010   (DE) .......................... 10 2010 001 398

(51) Int. Cl.
*H01L 27/12*    (2006.01)

(52) U.S. Cl.
USPC .... 257/350; 257/347; 257/384; 257/E29.242; 257/E29.255; 257/E27.06; 257/E27.112

(58) Field of Classification Search .................. 257/347, 257/350, 384, E29.242, E29.255, E27.06, 257/E27.112
See application file for complete search history.

(56) References Cited

U.S. PATENT DOCUMENTS

| | | | | |
|---|---|---|---|---|
| 6,716,679 B2 * | 4/2004 | Bae | ................................ | 438/132 |
| 2001/0023097 A1 * | 9/2001 | Huang | ........................... | 438/238 |
| 2001/0036707 A1 | 11/2001 | Patelmo et al. | ............... | 438/380 |
| 2008/0268585 A1 | 10/2008 | Gehring et al. | ............... | 438/152 |
| 2009/0194842 A1 * | 8/2009 | Ohara | ........................... | 257/506 |

FOREIGN PATENT DOCUMENTS

DE    102007004859 A1    8/2008

OTHER PUBLICATIONS

Translation of Official Communication from German Patent Office for German Patent Application No. 10 2010 001 398.6 dated Jan. 14, 2011.

* cited by examiner

*Primary Examiner* — Long Tran
(74) *Attorney, Agent, or Firm* — Williams, Morgan & Amerson, P.C.

(57) ABSTRACT

In an SOI semiconductor device, substrate diodes may be formed on the basis of a superior design of the contact level and the metallization layer, thereby avoiding the presence of metal lines connecting to both diode electrodes in the critical substrate diode area. To this end, contact trenches may be provided so as to locally connect one type of diode electrodes within the contact level. Consequently, additional process steps for planarizing the surface topography upon forming the contact level may be avoided.

20 Claims, 6 Drawing Sheets

SOI SEMICONDUCTOR DEVICE COMPRISING SUBSTRATE DIODES HAVING A TOPOGRAPHY TOLERANT CONTACT STRUCTURE

BACKGROUND OF THE INVENTION

1. Field of the Invention

Generally, the present disclosure relates to integrated circuits, and, more particularly, to SOI semiconductor devices comprising semiconductor elements, such as substrate diodes, that are formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes and in particular the gate length of the field effect transistors has been an important design criterion.

In view of further enhancing performance of transistors, in addition to other advantages, the SOI (semiconductor- or silicon-on-insulator) architecture has been continuously gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions, as well as the channel region, are located, also referred to as the body, is dielectrically encapsulated. This configuration provides significant advantages, but also gives rise to a plurality of issues.

For example, semiconductor elements, such as diodes and the like, may have to be implemented in the substrate material due to certain device requirements, thereby necessitating the formation of appropriate areas in which the substrate material has to be exposed. Any such area may be referred to as a substrate window and may affect the further processing due to a pronounced surface topography. For example, one important issue in high performance devices, such as microprocessors and the like, is an efficient device internal temperature management due to the significant heat generation of the transistors. Due to the reduced heat dissipation capability of SOI devices, caused by the buried insulating layer, the corresponding sensing of the momentary temperature in SOI devices is of particular importance. Typically, for thermal sensing applications, an appropriate diode structure may be used, wherein the characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to allow a precise estimation of the temperature conditions within the semiconductor device. In SOI devices, a corresponding diode structure, i.e., the respective PN junction, is frequently formed in a substrate window area, i.e., in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures.

Hence providing substrate diodes in sophisticated SOI semiconductor devices is a promising approach for obtaining reliable temperature data during the operation of the semiconductor device. Conventional approaches for forming substrate diodes may result in significant yield losses and, thus, loss of performance in the corresponding substrate window due to the continuous shrinkage of device features, such as transistors, lines and the like. For example, in sophisticated semiconductor devices comprising field effect transistors, the gate length has reached values of approximately 40 nm and less, thereby increasing packing density and also providing superior performance of the individual transistors. Similarly, the wiring network, i.e., the metallization system in combination with an appropriate contact level, has to be appropriately adapted to the increased packing density in the device level of sophisticated semiconductor devices, thereby also requiring contact elements and metal features of reduced lateral dimensions. At the same time, the thickness or height of the various metallization levels may also have to be reduced to correspond to the reduced lateral dimensions. During the fabrication of contact levels, i.e., the dielectric material and the corresponding contact elements formed therein that connect to the contact areas of the semiconductor-based circuit elements, and during the fabrication of the metallization layers of the complex metallization system, a plurality of very complex processes, such as lithography processes, deposition and patterning processes, have to be applied, which may be very sensitive to the overall surface topography of the semiconductor device at a specific manufacturing stage under consideration. In particular, many material removal processes based on a polishing process have been identified to cause significant irregularities when forming contact elements and metallization layers, as will be described in more detail with reference to FIG. 1.

FIG. 1 schematically illustrates a cross-sectional view of a semiconductor device 100, which represents an SOI device, since the device 100 comprises a substrate 101, a buried insulating layer 103 and a silicon-based semiconductor layer 104. The substrate 101 may represent a silicon substrate and, thus, comprises a crystalline substrate material 102, above which is formed the buried insulating layer 103, which is typically comprised of silicon dioxide. As illustrated, in a certain device area 110A, the buried insulating material 103 and the semiconductor layer 104 are at least partially removed in order to provide any circuit elements in the device area 110A within the crystalline substrate material 102. As previously indicated, the device area 110A may also be referred to as a substrate window and is frequently used for implementing a plurality of substrate diodes 150 in and above the crystalline substrate material 102 within the device area 110A. On the other hand, a device area 110B comprises the semiconductor layer 104, in and above which circuit elements are formed, such as sophisticated transistors and the like, wherein, for convenience, a single transistor element 160 is illustrated in FIG. 1.

As discussed above, in sophisticated applications, the transistor 160 may comprise a gate electrode structure having a gate length of approximately 40 nm and less. Furthermore, the transistor 160 comprises drain and source regions 162, wherein at least deeper areas thereof have substantially the same configuration, i.e., dopant concentration, as highly doped regions 152 of the substrate diode 150, wherein, however, the doped regions 152 are formed within an appropriately doped well region 102W provided in the crystalline substrate material 102 within the device area 110A. Similarly, the substrate diodes 150 may further comprise highly doped areas 153, which have a similar configuration as any drain and source regions of transistor elements of inverse conductivity type compared to the transistor 160. For convenience, any such transistors are not illustrated in FIG. 1. In the example shown, the transistor 160 may represent an N-channel transistor and, thus, the drain and source regions 162 and, thus, the highly doped regions 152 represent N-doped regions. In combination with an N-type doping in the well region 102W, the regions 152 may represent the cathode of the substrate diodes 150. On the other hand, the P-doped regions 153 may, thus, form a PN junction 102P with the N-type well region 102W and may, thus, act as an anode of the substrate diodes 150. Moreover, as illustrated, in view of reducing contact resistivity of the circuit elements 160 and 150, metal silicide regions 164 and 151, respectively, may be provided in the highly doped regions 162, 152, 153, for instance in the form of nickel silicide and the like. The cathode side, i.e., the region 152, and the anode sides, i.e., the region 153, in each substrate diode 150 are separated by a portion of the well region 102W above which portions of the buried insulating layer 103 and the semiconductor layer 104 are provided, as indicated as 103D, 104D. Depending on the overall process strategy, additional materials, such as a gate dielectric material, an electrode material, such as polysilicon and the like, may be formed above the portions 104D. It should further be appreciated that, in other cases, the portions 104D may represent an insulating material, i.e., the residues of isolation structures that are typically formed in the semiconductor layer 104 in order to laterally delineate corresponding active regions or semiconductor regions, in and above which are formed circuit elements, such as the transistor 160 and the like. For convenience, any such isolation structures are not shown in FIG. 1. Above the device level, i.e., the semiconductor layer 104 and any circuit elements formed therein and thereabove, such as the transistor 160, and above the substrate diodes 150 within the device area 110A, a contact level 120 is provided, which may be considered as an interface for connecting the circuit elements 160, 150 with a metallization system, of which a very first metallization layer 130 is illustrated, for convenience. The contact level 120 comprises one or more appropriate dielectric materials, such as a layer 121 in combination with a layer 122 provided, for instance, in the form of silicon nitride and silicon dioxide, respectively. Additionally, the contact level 120 comprises contact elements 123A, 123B that connect to the doped semiconductor regions 152, 153 on the one hand and to doped semiconductor regions in the layer 104, such as the drain and source regions 162. The contact elements 123A, 123B are provided in the form of any appropriate conductive material, such as tungsten, aluminum and the like, possibly in combination with appropriate conductive barrier materials, such as titanium nitride, titanium and the like.

The metallization layer 130 comprises any appropriate dielectric material or materials, such as low-k dielectric material, which are to be understood as dielectric materials having a dielectric constant of 3.0 and less, in combination with any other materials, such as etch stop layers (not shown) and the like. Furthermore, metal lines 133A are provided in the dielectric material 131 so as to connect to the contact elements 123A within the device area 110A, while metal lines 133B connect to the contact elements 123B in the device area 110B. The metal lines 133A, 133B are typically comprised of copper in combination with appropriate conductive barrier materials, such as tantalum, tantalum nitride and the like.

The semiconductor device 100 as illustrated in FIG. 1 may be formed on the basis of the following process strategy. The well region 102W of the crystalline substrate material 102 within the device area 110A may be formed at any appropriate manufacturing stage, i.e., upon forming corresponding active regions in the semiconductor layer 104 by performing masked implantation processes. To this end, a high energy implantation process is performed so as to implant the well dopant species of the region 102W through the layers 104 and 103 and into the crystalline substrate material 102. In other cases, the substrate window 110A may be formed first by providing an appropriate etch mask so as to etch through the layers 104, 103, thereby exposing portions of the substrate material 102 within the device area 110A, while preserving the portions 104D, 103D. In other cases, a corresponding etch process for exposing portions of the material 102 within the area 110A may be performed after forming corresponding gate electrode structures, such as the gate electrode structure 161 of the transistor 160. Thereafter, any appropriate processes are performed so as to complete the transistor 160, thereby performing appropriate implantation processes for forming the drain and source regions 162 of N-type and P-type transistors, thereby also applying an appropriate masking regime for forming the highly doped regions 152 and 153 of the substrate diodes 150. After any anneal processes for activating dopants and re-crystallizing implantation-induced damage, while also initiating a dopant diffusion, if desired, the metal silicide regions 164, 151 may be formed commonly in the transistor 160 and the substrate diodes 150. Consequently, the circuit elements 160 and 150 may be formed on the basis of substantially the same process sequence, thereby providing a very efficient overall manufacturing flow, while, however, a significant difference in height level between the device areas 110A and 110B is generated. The pronounced surface topography caused by this difference in height levels, in turn, may result in significant irregularities in the further processing of the device 100. That is, upon depositing the dielectric material or materials of the contact level, a certain degree of height difference may still exist between the device areas 110A, 110B. That is, typically, the material 121, such as a silicon nitride material, is deposited on the basis of plasma enhanced chemical vapor deposition (CVD) techniques having a more or less conformal deposition behavior. Thereafter, the material 122, for instance in the form of silicon dioxide, is deposited, for instance by a deposition technique of superior gap filling capability, for instance high-density plasma CVD, sub-atmospheric CVD, thereby providing a certain degree of leveling between the areas 110A, 110B, wherein, however, a certain global difference in height level may still further exist, even if performing any additional polishing processes for improving the overall surface topography. After providing the dielectric material 122 sophisticated lithography processes are applied in order to form an appropriate etch mask, for instance in the form of a hard mask, a resist mask and the like, which may be used during the subsequent anisotropic etch sequence for etching through the material 122 and finally through the material 121 and into the metal silicide regions 164, 151. Thereafter, the contact openings are filled with the desired conductive material, possibly in combination with a conductive barrier material, and any excess material thereof is removed by chemical mechanical polishing (CMP), wherein process parameters have to be adapted so as to also reliably remove any metal residues in the device area 110A having the reduced global height level. In device generations including transistor elements of approximately 60 nm gate length, a corresponding difference in height level, as indicated by 110H, has been taken into consideration by providing the dielectric material 122 with increased thickness so as to generally take advantage of the non-conformal deposition behavior, possibly in combination with the leveling effect of a CMP process, while the removal of any excess material of the contact elements 123A, 123B has been performed on the basis of process parameters in which a high degree of "dishing" is achieved, i.e., a superior removal of metal compared to the dielectric material 122. In this manner, the excess metal of the contact level may be removed efficiently from within the device area 110A, which, however, may result in a height level difference 110H of approximately 60 nm and even more. Thereafter, the metallization layer 130 is formed by depositing the dielectric material 131 based on any appropriate process strategy, followed by the patterning of the material 131 based on sophisticated lithography techniques. Next, any appropriate conductive barrier material (not shown) is deposited, followed by the deposition of the actual fill material, such as copper and the like. Thereafter, any excess material is removed by appropriate planarization techniques, such as CMP, thereby also requiring the removal of the conductive materials within the device area 110A, which may have a different height level 110D. Consequently, upon reliably removing any metal residues from within the device area 110A, a significant reduction in thickness of the metallization layer 130 in the device area 110B may result, which may, thus, reduce performance of any metal lines 133B provided therein.

Upon further scaling the size of the individual circuit elements, lateral feature sizes and generally the thickness of the metallization layer 130 also have to be adapted. For example, in technologies using a gate length of 40 nm and less, a thickness of the metallization layer 130 may be of a similar order of magnitude as the height differences 110H or 110D, which would, thus, lead to a non-acceptable reduced thickness of the metallization layer 130 in the device area 110B after having reliably removed the excess material in the device area 110A. On the other hand, further increasing the thickness of the dielectric material 122 of the contact level 120 so as to further reduce the height difference 110H may not be a promising option, since significant variations may occur during the complex patterning process for forming the contact elements 123A, 123B due to, for instance, the significant height differences at a generally increased etch depth in the contact level, thereby contributing to significant substrate-to-substrate variations. Consequently, in the conventional approach, typically, a compromise of CMP parameters and thickness of the levels 120 and 130 may be applied, while, however, a significant probability exists that any metal residues may remain in the device area 110A after completing the corresponding polishing process. In this case, leakage paths or short circuits between metal lines 133A may be created, thereby at least reducing performance of the substrate diodes 150 or causing a complete failure of one of these devices. Since reliable temperature data may strongly depend on the diode characteristics, a reduction in the reliability or a degradation of performance of the substrate diodes may contribute to significant yield losses and/or reduced functionality of the semiconductor device 100.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices in which substrate diodes may be efficiently formed in the crystalline substrate material of the semiconductor device, such as an SOI device, wherein the resulting surface topography, i.e., the difference in height level between a device area comprising transistor elements and a substrate diode area or substrate window, may not negatively affect performance of the substrate diodes when forming sophisticated contact and metallization levels. To this end, the geometric arrangement, i.e., the design and the corresponding implementation in actual semiconductor devices, may be appropriately adjusted such that any metal residues that may remain in the metallization layer upon removing any excess material, for instance by CMP and the like, may not negatively affect the overall performance in the substrate diode area. That is, the substrate diode area may be reconfigured such that metal lines may be formed within the area of the substrate diodes which are electrically connected exclusively to one type of diode electrodes, i.e., either the cathodes or the anodes, so that any possible leakage paths created during the formation of the metallization layer may not affect the overall electrical performance of the substrate diodes. On the other hand, the other type of diode electrodes may be connected to metal lines provided with increased lateral distance with respect to any metal lines positioned in the critical area of reduced height level, thereby reliably avoiding any electrical leakage paths between cathodes and anodes of the substrate diodes provided within the substrate diode area. In some illustrative aspects disclosed herein, the connection of one type of diode electrodes may be accomplished within the contact level by providing appropriately configured contact elements in the form of local interconnects, which may then be connected to the metallization level with the desired lateral distance so as to avoid any leakage paths within the metallization layer. Consequently, sophisticated semiconductor devices may be formed on the basis of design requirements selected in accordance with electrical performance rather than providing a less pronounced surface topography, while at the same time the probability of creating leakage paths between anodes and cathodes of the substrate diode may be significantly reduced without requiring additional process steps.

One illustrative semiconductor device disclosed herein comprises a plurality of substrate diodes formed in and above a crystalline substrate material in a first device area, wherein each of the plurality of substrate diodes comprises a first diode electrode and a second diode electrode. The semiconductor device further comprises a transistor formed in and above a semiconductor layer that is provided in a second device area, wherein the semiconductor layer is formed on a buried insulating layer. Additionally the semiconductor device comprises a contact level formed above the transistor and the plurality of substrate diodes, wherein the contact level comprises a dielectric material and a plurality of contact elements, wherein each of a first subset of the plurality of contact elements connects to a respective one of the first diode electrodes and wherein at least a second one of the plurality of contact elements connects to each second diode electrode of the plurality of substrate diodes. Moreover, the semiconductor device comprises a metallization layer formed above the contact level and comprising a plurality of metal lines so as to connect to the plurality of contact elements.

One illustrative SOI semiconductor device disclosed herein comprises a substrate diode area comprising cathode regions and anode regions that are formed in a crystalline substrate material of the SOI device. The semiconductor device further comprises a contact level formed above the substrate diode area and comprising a dielectric material and a plurality of contact elements, wherein each contact element connects to a respective one of the anode regions and wherein the contact level further comprises at least one contact trench formed in the dielectric material and connecting to each of the cathode regions. Furthermore, the semiconductor device comprises a metallization layer formed above a contact level and comprising a dielectric material and at least a first metal line and a second metal line, wherein the first metal line electrically connects to each of the anode regions and wherein the second metal line connects to the contact trench.

A still further illustrative semiconductor device disclosed herein comprises a substrate diode area comprising a plurality of anode regions and a plurality of cathode regions that are formed in a portion of a crystalline material of a substrate of the semiconductor device. The semiconductor device further comprises a metallization layer formed above the crystalline substrate material and comprising metal lines formed in a dielectric material of the metallization layer, wherein any metal line of the metallization layer that is positioned in the substrate diode area is connected to exclusively the plurality of anodes or the plurality of cathodes.

BRIEF DESCRIPTION OF THE DRAWINGS

The disclosure may be understood by reference to the following description taken in conjunction with the accompanying drawings, in which like reference numerals identify like elements, and in which.

Figure 1:
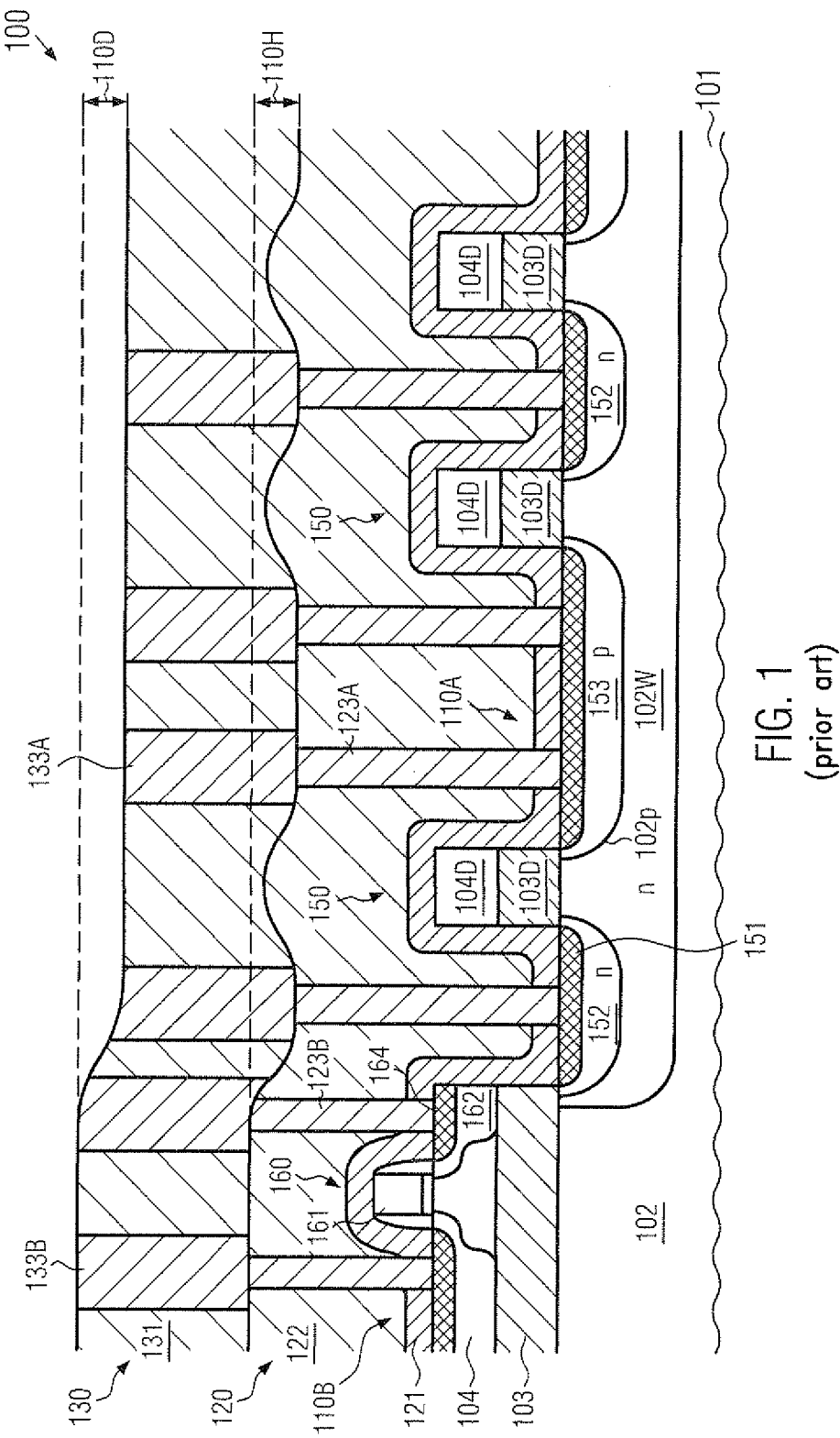
FIG. 1 schematically illustrates a cross-sectional view of a semiconductor device comprising a plurality of substrate diodes formed in the crystalline substrate material of an SOI device, wherein a pronounced difference in height level between the substrate window and a device area may result in performance degradation or failure of substrate diodes when providing the contact level and the subsequent metallization level on the basis of conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices which may be formed in accordance with an appropriate geometrical configuration or layout in order to reduce electrical failure of substrate diodes, which may conventionally be caused by the significant difference in height level between device areas and substrate diode areas in sophisticated SOI devices. The semiconductor devices disclosed herein have a configuration in the substrate diode area such that creating any leakage paths upon forming the metallization layer above the contact level may not negatively influence the electrical performance of the substrate diodes. In this manner, well-established process techniques may be applied, however, without requiring additional process steps, for instance, for reducing the surface topography upon forming the contact level and the like, while nevertheless enabling providing the contact level and the metallization layer with a thickness that complies with sophisticated design requirements. To this end, one type of diode electrode may be connected within the contact level, while, in the metallization layer, the presence of any metal lines connecting to these diode electrodes may be avoided. On the other hand, the diode electrodes of the other type may be individually connected through the metallization layer via standard contact elements so that metal lines connecting to this type of diode electrodes may be exclusively positioned within the critical substrate window, wherein, however, any leakage paths between these metal lines may not influence the electrical performance, as electrical connection of these diode electrodes is required by the circuit configuration at any rate. Furthermore, since contact resistivity is determined by the metal lines and the corresponding contact elements, any additional leakage currents may have substantially no influence on the finally achieved electrical behavior of the substrate diodes.

In some illustrative embodiments, the local interconnect structures for connecting one type of diode electrodes within the contact level may be provided for cathodes, which may be represented by highly N-doped semiconductor regions formed in an N-doped well region, since, in this case, any tensile stress component, which may be created by the local interconnect structure, may not negatively influence the conductivity in the highly doped semiconductor regions. On the other hand, a corresponding tensile stress may be reduced by using standard contact elements for the plurality of anode regions, thereby "minimizing" the presence of a tensile stressed conductive material of the contact elements, as is the case in conventional approaches.

With reference to FIGS. 2a-2e, further illustrative embodiments will now be described in more detail, wherein reference may also be made to FIG. 1, if required.

Figure 2A:
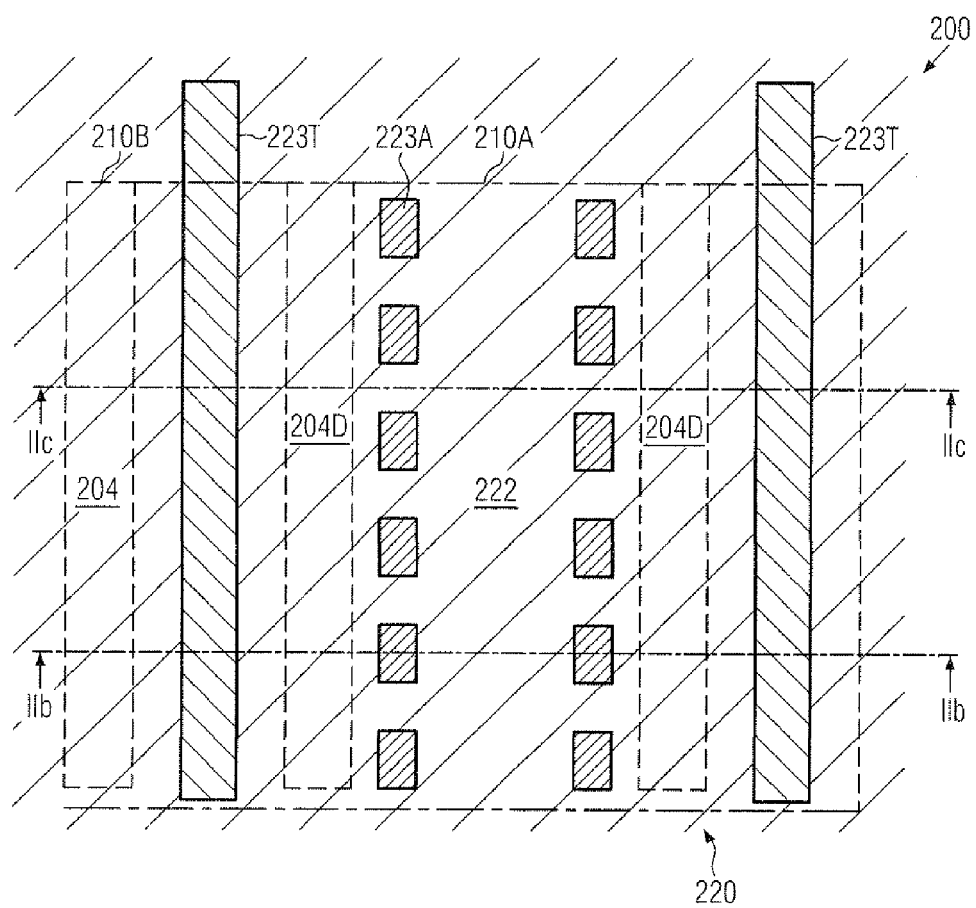
FIG. 2a schematically illustrates a top view of a semiconductor device in which a substrate diode area or substrate window is provided and comprises a plurality of substrate diodes or diode elements which may be appropriately designed and thus arranged to avoid electrical leakage between anodes and cathodes of the substrate diodes, according to illustrative embodiments.

FIG. 2a schematically illustrates a top view of a semiconductor device 200 in a manufacturing stage in which a device level 220 may be provided in a first device area 210A and a second device area 210B. The first device area 210A, which may also be referred to as a substrate window or a substrate diode area, may have any appropriate lateral dimensions so as to receive a plurality of substrate diodes or diode elements having any appropriate configuration, as is also previously discussed with reference to the semiconductor device 100 when referring to FIG. 1. Furthermore, a corresponding description of the substrate diodes and any circuit elements, such as transistors, may be given with respect to FIGS. 2b and 2c. For example, the second device area 210B may be represented by a semiconductor layer 204, indicated by dashed lines, in and above which circuit elements, such as transistors, may be formed. On the other hand, the semiconductor layer 204 and buried insulating material positioned below (not shown) may be patterned in the device area 210A, as indicated by layer portions 204D. In this manner, corresponding anode and cathode areas may be defined within the substrate area 210A in accordance with device requirements. The device level 220 may comprise any appropriate dielectric material, such as a dielectric material 222 and contact elements 223A formed therein, which may have a standard configuration in view of lateral dimensions, material composition and the like. The contact elements 223A may directly connect to corresponding contact areas of the substrate diodes, as will be described later on in more detail, or as is also described with reference to FIG. 1 when referring to the contact elements 123A. Contrary to the conventional configuration, however, the contact elements 223A may connect to one type of diode electrodes only, for instance, in some illustrative embodiments, to the anodes, wherein the individual contact elements 223A may be connected upon forming a first metallization layer above the contact level 220, as is also previously explained. Moreover, the contact level 220 may comprise contact elements 223T, which may be provided in the form of contact trenches, which may thus provide electrical connection to the other type of diode electrodes, such as cathodes, so that any individual cathode area provided at the left-hand side of the layer portion 204D may be connected to the contact element 223T. Consequently, a connection of individual electrodes provided in this area do not need to be connected via a dedicated metal line in the substrate metallization level. Consequently, a corresponding metal line, as is required in the conventional design (see, for instance, the metal lines 133A in FIG. 1) may not be required for one type of diode electrodes. Consequently, the local interconnects or contact trenches 223T may be connected to the subsequent metallization layer at any appropriate position within the semiconductor device 200 and may thus be contacted outside of the substrate diode area 210A, which may represent a very critical area upon forming the metallization layer due to the reduced height level compared to the device area 210B, as is previously explained.

Figure 2B:
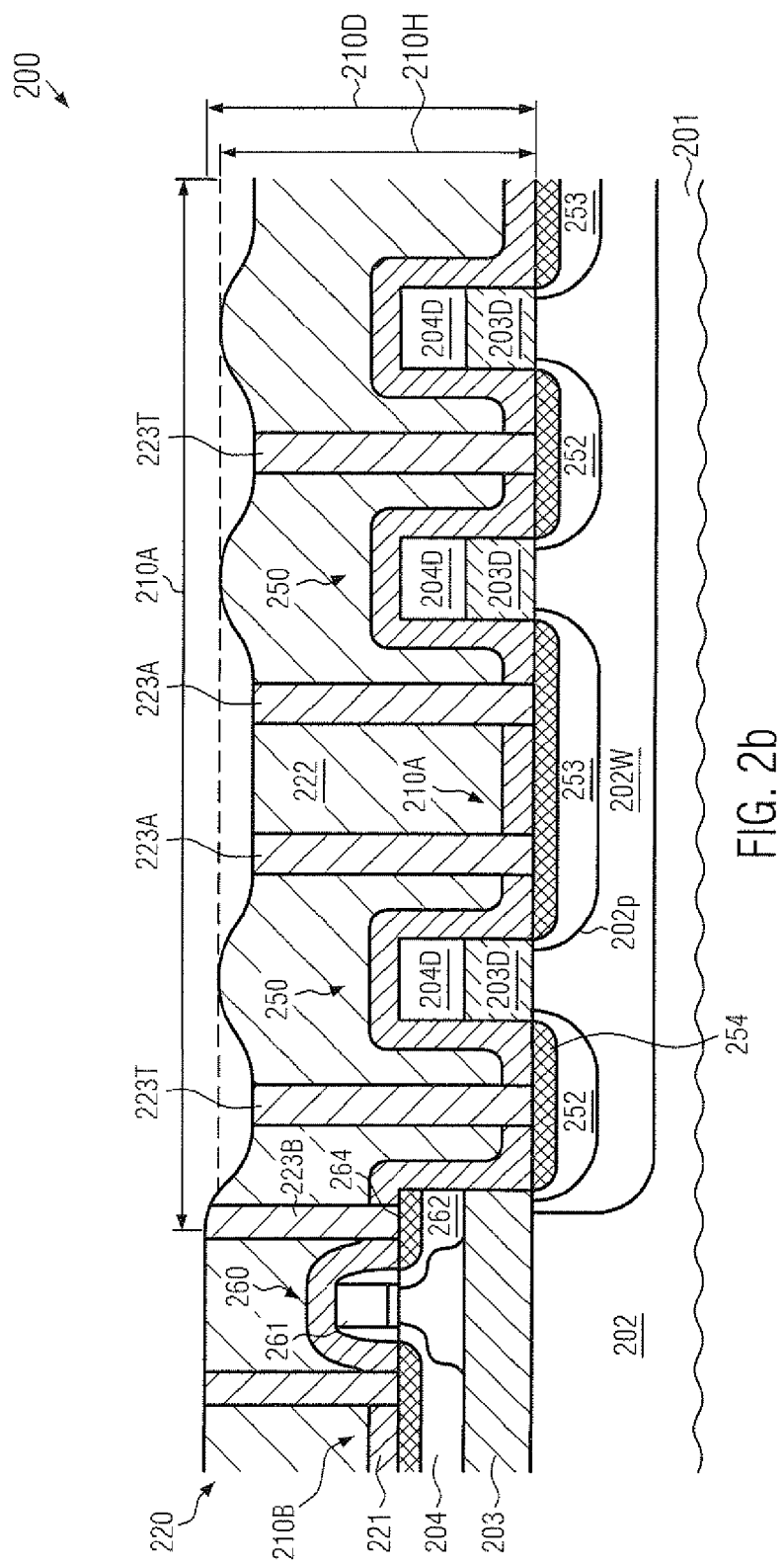
FIGS. 2b and 2c schematically illustrate cross-sectional views of the semiconductor device as shown in FIG. 2a along the lines IIc and IIb in a manufacturing stage in which the contact level having the superior configuration may be provided in accordance with illustrative embodiments.

FIG. 2b schematically illustrates a cross-sectional view of the semiconductor device 200 along the line IIb of FIG. 2a. As illustrated, the device 200 may comprise a substrate 201 comprising a crystalline substrate material 202, in which may be provided within the substrate diode area 210A an appropriately doped well region 202W. Moreover, highly doped regions 252, 253 may be provided in the well region 202W and may have an appropriate type of doping in order to represent diode electrodes of substrate diodes 250 in accordance with overall device requirements. For example, the regions 252 may also be referred to as cathode regions when comprising any dopant species so as to impart an N-type conductivity to the regions 252. On the other hand, the region 253 may also be referred to as an anode region when having a P-type conductivity. Depending on the conductivity type of the well region 202W, a corresponding PN junction of the substrate diode 250 may be formed by the regions 252 or 253. When using a similar configuration as described above with reference to FIG. 1, a PN junction 202P may be formed in the region 253 and the N-doped well region 202W. Moreover, the regions 252, 253 may have formed therein metal silicide regions 254, thereby reducing the overall contact resistivity of the substrate diodes 250. It should be appreciated, however, that any other contact regime for connecting to the regions 252, 253 may be implemented.

As illustrated, in the device area 210B, a buried insulating layer 203 in combination with a semiconductor layer 204 may be provided, thereby forming an SOI configuration, as previously discussed. A transistor 260 may be formed in and above the semiconductor layer 204 within the device area 210B. Furthermore, layer portions 204D in combination with portions of the buried insulating layer 203D may be provided within the substrate diode area 210A, thereby laterally delineating the various regions 252, 253. With respect to any characteristics of the transistor 260, for instance in view of a gate electrode structure 261 and drain and source regions 262, the same criteria may apply as previously explained with reference to the semiconductor device 100. Moreover, the cathode regions and anode regions 252, 253 may be formed with a high degree of compatibility with corresponding drain and source regions of transistors, such as the drain and source regions 262, as is also previously discussed. It should be appreciated, however, that the substrate diodes 250, if required, may also be formed in a substantially decoupled manner with respect to the electrical characteristics of the transistor 260, if considered appropriate. Furthermore, the contact level 220 may comprise any appropriate dielectric material or materials, such as a dielectric material 221, for instance in the form of silicon nitride and the like, in combination with the material 222. Moreover, the contact elements 223A may connect to the anode region 253 of the various individual diode cells, as is also illustrated in FIG. 2a, while the cathode regions 252 may be contacted by the contact trenches 223T, which may continuously extend in a direction perpendicular to the drawing plane of FIG. 2b. Consequently, the individual cathode portions or cells of each of the regions 252 may be directly connected by means of the corresponding contact trench 223T so that additional electrical connection for the various areas in each of the cathode regions 252 via an additional metal line is not necessary. In this manner, the contact trenches 223T may be considered as local interconnects, since an electrical connection of individual areas within each of the cathode regions 252 may be established within the contact level 220, without requiring any additional electrical connections in the subsequent metallization layer.

As previously explained with reference to FIG. 1, a height level 210H, which may be considered as an average height level in the substrate diode area 210A, may be less compared to a height level 210D in the device area 210B caused by removal of layer portions of the layers 204 and 203 within the substrate diode area 210A, as previously discussed.

Figure 2C:
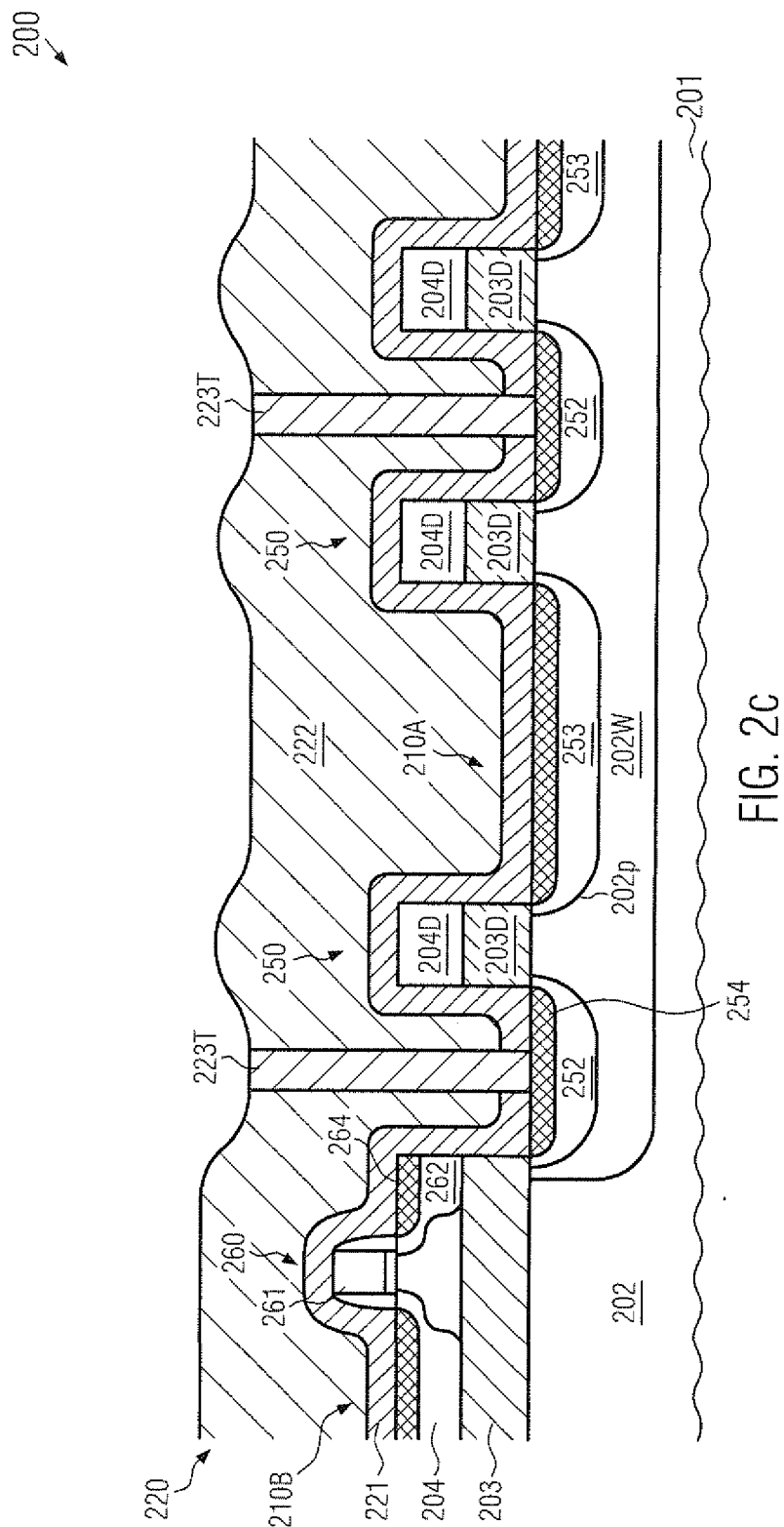

FIG. 2c schematically illustrates the semiconductor device 200 in a cross-sectional view along the line IIc, as indicated in FIG. 2a. Consequently, in this cross-section, the contact trenches 223T may still be provided in the contact level 220, i.e., at least in the dielectric materials 222 and 221. Furthermore, in the embodiment shown, it may be assumed that the cathode regions 252 and the anode regions 253 may continuously extend along a direction perpendicular to the drawing plane of FIG. 2c, while, in other cases, if laterally separated individual diode cells may be considered appropriate, corresponding layer portions 204D and 203D may extend in the horizontal direction of FIG. 2c, thereby providing a similar separation as the layer portions 204D, 203D in the horizontal direction in FIG. 2c, as shown. Irrespective of the separation of the substrate diode area 210A into substantially separated individual diode cells or in cathode and anode regions, which extend substantially continuously in a direction perpendicular to the drawing plane of FIG. 2c, a regular connection to the underlying highly doped areas may be required in order to provide a uniform diode operation, which may otherwise be influenced by any differences in contact resistivity. Consequently, the required electrical connection to the entire cathode region 252 in the direction perpendicular to the drawing plane of FIG. 2c may be accomplished by the single contact trench 223T, while a substantially continuous connection of the anode region 253 may be accomplished by the plurality of contact elements 223A (FIGS. 2a and 2b). It should be appreciated that providing single contact elements for connecting to the anode regions 253 may be advantageous with respect to electrical performance of the anode regions 253, since frequently the metal material in the contact elements may be provided with a tensile stress component, which may then also act on the doped region 253. In this case, the tensile stress may result in performance degradation and, hence, "minimizing" the corresponding stress component by providing individual contact elements as necessary for obtaining the electrical performance may in total result in superior performance. On the other hand, the corresponding tensile stress component induced by the contact trenches 223T may not negatively affect the cathode regions 252 due to the different type of conductivity.

The semiconductor device as shown in FIGS. 2a-2c may be formed on the basis of any appropriate process technique for forming the substrate diodes 250 and the transistor 260, wherein, for instance, the process techniques may be applied as described above with reference to the semiconductor device 100. Hence, after completing the basic configuration of the transistor 260 and of the substrate diodes 250, the contact level 220 may be formed by depositing any appropriate materials, such as the layers 221 and 222, and patterning these materials on the basis of sophisticated lithography and etch techniques. Upon forming appropriate openings for the contact elements 223A, 223B, an appropriate lithography mask may be used so as to take into consideration the configuration of the trenches 223T. Thereafter, the corresponding openings, i.e., the contact holes and the trenches, may be filled with an appropriate material, such as tungsten and the like, wherein, as previously discussed, with respect to any tensile stress component, similar conditions may be achieved as in conventional approaches, as any increased tensile stress component in the cathode regions 252 may not negatively influence the overall performance of the substrate diodes 250. On the other hand, if a corresponding tensile stress may enhance overall charge carrier mobility in the cathode region 252, the increased amount of metal material in the trenches 223T may contribute to superior performance of the substrate diodes 250. Next, any excess material may be removed, for instance by CMP or any other planarization technique. Thereafter, the processing may be continued by forming a metallization layer in which the position of the metal lines may be adapted to the position of the contact elements 223A, for instance similar to conventional configurations, while the contact trenches 223T may also be appropriately contacted, however, with an appropriate lateral distance to the metal lines connecting to the standard contact elements 223A. In this manner, a superior robustness with respect to creating metal residues may be achieved since any metal residues may only establish an electrical connection between metal lines directly connecting to the contact elements 223A, which may have to be connected to each other anyway.

Figure 2D:
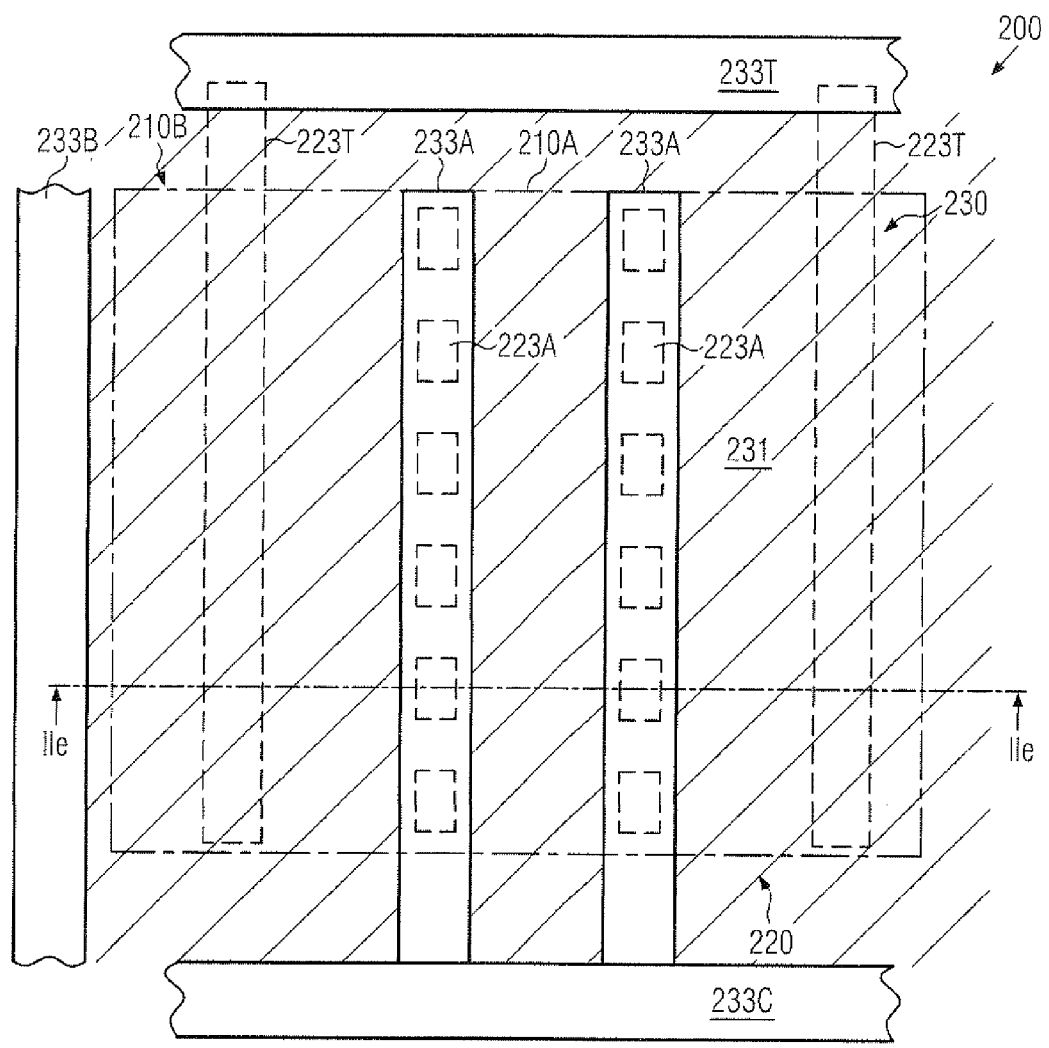
FIG. 2d schematically illustrates a top view of the semiconductor device including the metallization layer formed above the contact level according to illustrative embodiments in which metal lines connecting to either cathodes or anodes are provided in the critical substrate diode area.

FIG. 2d schematically illustrates a top view of the semiconductor device 200 in a further advanced manufacturing stage. As illustrated, a metallization layer 230 may be formed in the area 210A and the area 210B and may comprise any appropriate dielectric material 231 in combination with metal lines 233A, 233B, 233C and 233T. In the example shown, the metal lines 233A may connect to the contact elements 223A, which in turn may connect to the same type of diode electrode, as previously explained. In the embodiment shown, the metal lines 233A may be the only metal lines that may extend within the area 210A, which may have a reduced height level and which may thus represent a critical area in terms of removing any excess material upon forming the metal lines of the layer 230, as is also explained above. For example, the metal lines 233A may be connected by the metal line 233C at any appropriate area, for instance outside of the substrate diode area 210A. It should be appreciated that, in some illustrative embodiments, the line 233C may also extend, at least partially, within the area 210A, if considered appropriate in view of overall design requirements. On the other hand, the metal line 233T connecting the contact trenches 223T may be provided so as to obtain a high lateral distance with respect to any of the metal lines connected to the contact elements 223A, such as the metal lines 233A, 233C, thereby avoiding or at least significantly reducing the probability of creating any leakage paths between the contact elements 223A and 223T and thus the cathode regions and anode regions. In the embodiment shown, the metal line 233T may be positioned outside of the critical substrate diode area 210A. Furthermore, any metal lines 233B may be formed in the device region 210B in accordance with device requirements.

Figure 2E:
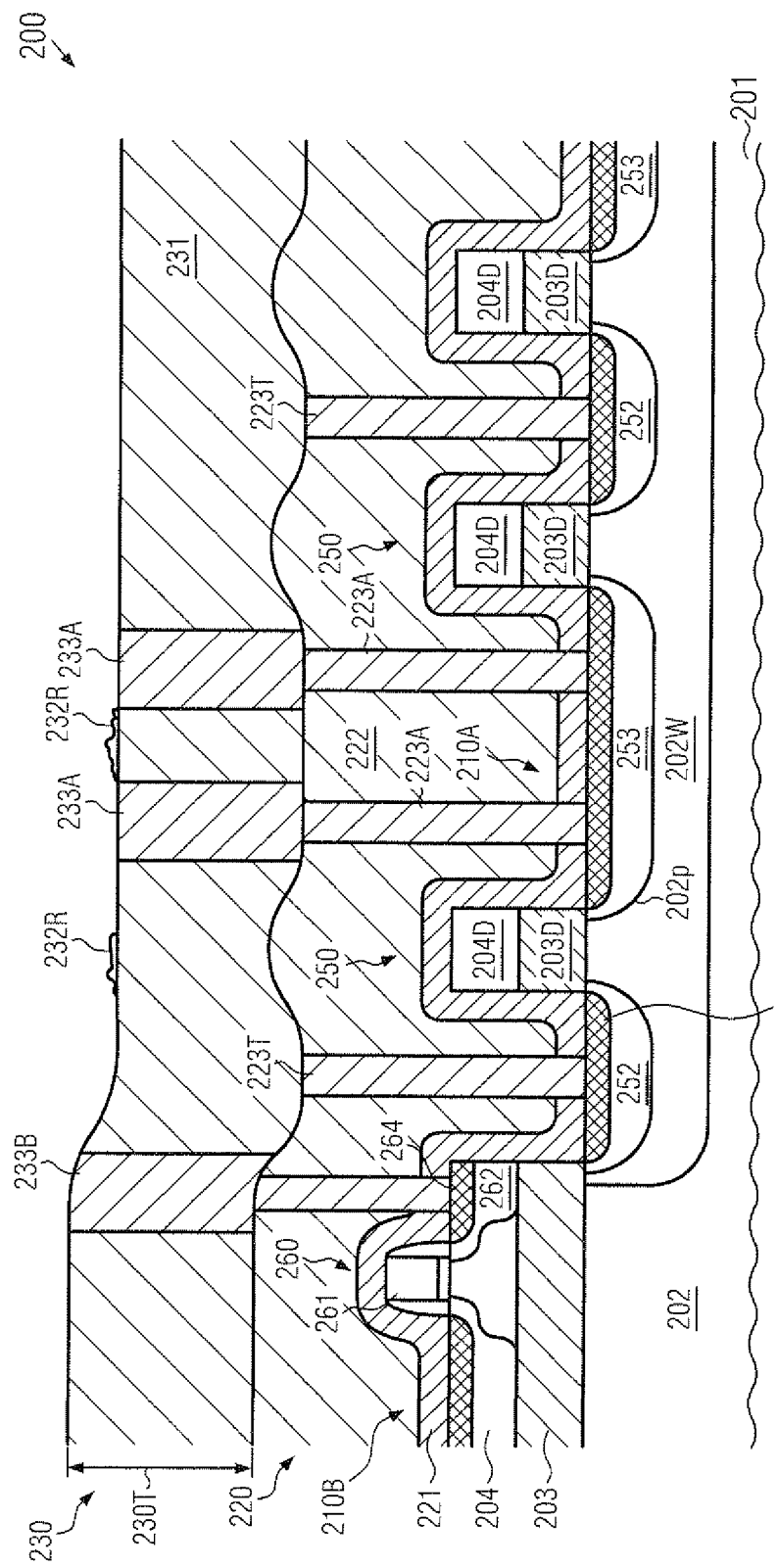
FIG. 2e schematically illustrates a cross-sectional view of the semiconductor device as shown in FIG. 2d.

FIG. 2e schematically illustrates a cross-sectional view of the semiconductor device taken along the line IIe of FIG. 2d. As illustrated, the metallization layer 230 may be formed above the contact level 220 and may have a thickness 230T above the device area 210B in accordance with design requirements. That is, the thickness 230T may be 150 nm and less in sophisticated applications, wherein, typically, a difference in height level between the area 210A and the area 210B after providing the contact level 220 may be approximately 50-80 nm and may thus be comparable with the desired thickness 230T. As discussed above, the metallization layer 230 may typically be formed by depositing the dielectric material 231 and patterning the same so as to form corresponding trenches for the metal lines 233A, 233B, 233C and 233T (FIG. 2d), which are subsequently filled with an appropriate conductive material, such as conductive barrier materials (not shown), copper and the like. Thereafter, the removal of any excess material may typically be performed by using a polishing process, wherein a certain probability may exist to create metal residues 232R, some of which may even provide a leakage path between the metal lines 233A. However, these residues 232R may not negatively influence the overall electrical performance of the device 200, since the metal lines 233A may be connected to each other and represent the same diode electrode, as previously explained. It should be appreciated that even a substantially continuous metal layer formed within the substrate diode area 210A may not negatively influence the performance of the substrate diodes 250, since, in the embodiments shown, the metal lines 233A may represent the only metal lines that are provided in the substrate diode area 210A. Consequently, in some illustrative embodiments, a corresponding planarization or removal process for clearing the metal lines 233B in the device area 210B may be provided on the basis of a high degree of flexibility with respect to process parameters, for instance total process time of the planarization process, since the presence of the metal residues 232R, for instance even in the form of a continuous metal line, may not affect the operation of the substrate diode 250.

As a result, the present disclosure provides semiconductor devices in which the pronounced surface topography caused by substrate windows used for forming substrate diodes in SOI devices may not negatively influence the electrical performance of the substrate diodes, which may conventionally be caused by metal residues in the substrate diode area when a reduced design thickness of the metallization layer may not allow a pronounced over-polish time during the planarization process. By avoiding metal lines connecting to two different diode electrodes in the critical substrate diode area, the presence of any metal residues or even of a continuous metal layer may thus not negatively affect the performance of the substrate diodes. In this manner, additional process steps for planarizing the surface topography upon forming the contact level may be avoided, which may thus result in a very efficient process flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a plurality of substrate diodes formed in and above a crystalline substrate material in a first device area, each of said plurality of substrate diodes comprising a first diode electrode and a second diode electrode;
    a transistor formed in and above a semiconductor layer provided in a second device area, said semiconductor layer being formed on a buried insulating layer;
    a contact level formed above said transistor and said plurality of substrate diodes, said contact level comprising a dielectric material, a plurality of first contact elements, and at least one second contact element, wherein each of said plurality of first contact elements directly connects to a respective one of said first diode electrodes of said plurality of substrate diodes, and said at least one second contact element directly connects to each second diode electrode of said plurality of substrate diodes; and
    a metallization layer formed above said contact level and comprising a plurality of metal lines so as to connect to said plurality of first contact elements and said at least one second contact element.

2. The semiconductor device of claim 1, wherein said second diode electrodes represent cathodes.

3. The semiconductor device of claim 1, wherein a height level of said contact level above said first device area is less than a height level of said contact level above said second device area.

4. The semiconductor device of claim 3, wherein said at least one second contact element directly connects to one of said plurality of metal lines outside of said first device area.

5. The semiconductor device of claim 1, wherein said plurality of metal lines have a thickness of approximately 150 nm or less.

6. The semiconductor device of claim 1, wherein a PN junction of each of said plurality of substrate diodes is formed in an N-doped well region formed in said crystalline substrate material.

7. The semiconductor device of claim 1, wherein a gate length of said transistor is approximately 40 nm or less.

8. The semiconductor device of claim 1, wherein said height level of said contact level above said first device area is approximately 50-80 nm less than said height level of said contact level above said second device area.

9. An SOI semiconductor device, comprising:
    a substrate diode area comprising a plurality of cathode regions and a plurality of anode regions formed in a crystalline substrate material of said SOI semiconductor device;
    a contact level formed at least above said substrate diode area of said SOI semiconductor device and comprising a dielectric material and a plurality of contact elements, each of said plurality of contact element directly connecting to a respective one of said plurality of anode regions, said contact level further comprising at least one contact trench formed in said dielectric material, said at least one contact trench directly connecting to each of said plurality of cathode regions; and a metallization layer formed above said contact level and comprising a dielectric material and at least a first metal line and a second metal line, said first metal line electrically connecting to each of said plurality of anode regions, said second metal line directly connecting to said contact trench.

10. The semiconductor device of claim 9, further comprising a transistor area comprising a transistor formed in and above a semiconductor layer of said semiconductor device, wherein a height level of said contact level above said substrate diode area is less than a height level of said contact level above said transistor area.

11. The semiconductor device of claim 9, wherein a gate length of said transistor is approximately 40 nm or less.

12. The semiconductor device of claim 9, wherein a thickness of said metal lines is approximately 150 nm or less.

13. The semiconductor device of claim 9, wherein said second metal line is positioned laterally outside said substrate diode area.

14. The semiconductor device of claim 9, wherein said metallization layer comprises a plurality of said first metal lines formed above said substrate diode area and connecting to said plurality of contact elements.

15. The semiconductor device of claim 14, wherein said plurality of said first metal lines are the only metal lines of said metallization layer that are formed above said substrate diode area.

16. A semiconductor device, comprising:
a substrate diode area comprising a plurality of anode regions and a plurality of cathode regions formed in a portion of a crystalline material of a substrate of said semiconductor device; and a metallization layer formed above said crystalline substrate material and comprising metal lines formed in a dielectric material of said metallization layer, wherein any metal line of said metallization layer that is positioned above said substrate diode area is exclusively electrically connected to said plurality of anode regions.

17. The semiconductor device of claim 16, further comprising a device area positioned laterally outside said substrate diode area, said device area comprising a semiconductor layer formed above a buried insulating material that is formed above said crystalline substrate material, wherein a height level of said metallization layer above said substrate diode area is less than a height level of said metallization layer above said device area.

18. The semiconductor device of claim 17, further comprising one or more second metal lines formed in said metallization layer that electrically connect to said plurality of cathodes.

19. The semiconductor device of claim 18, wherein said one or more second metal lines are electrically connected to contact trenches formed above said substrate diode area in a contact level of said semiconductor device.

20. The semiconductor device of claim 19, wherein a thickness of said metallization layer is approximately 150 nm or less.

* * * * *